US008410850B2

(12) United States Patent
Mazzucco et al.

(10) Patent No.: US 8,410,850 B2
(45) Date of Patent: Apr. 2, 2013

(54) SIGNAL PROCESSING ARRANGEMENT AND SIGNAL PROCESSING METHOD

(75) Inventors: Christian Mazzucco, Milan (IT); Maurizio Mattivi, Milan (IT); Sergio Bianchi, Milan (IT); Francesco Lenoci, Milan (IT)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/493,189

(22) Filed: Jun. 11, 2012

(65) Prior Publication Data

US 2012/0306573 A1    Dec. 6, 2012

Related U.S. Application Data

(63) Continuation of application No. PCT/CN2010/080197, filed on Dec. 23, 2010.

(51) Int. Cl.
*H03F 1/26* (2006.01)
(52) U.S. Cl. ........................................ 330/149
(58) Field of Classification Search ................ 330/149; 455/63.1, 114.3, 126; 375/296, 297
See application file for complete search history.

(56) References Cited

U.S. PATENT DOCUMENTS

| 4,291,277 | A | 9/1981 | Davis et al. |
| 6,239,657 | B1 * | 5/2001 | Bauer ........................... 330/149 |
| 6,246,286 | B1 * | 6/2001 | Persson ......................... 330/149 |
| 2004/0179629 | A1 | 9/2004 | Song et al. |

FOREIGN PATENT DOCUMENTS

EP    2 117 115 A1    11/2009

OTHER PUBLICATIONS

Saleh, Adel A., "Frequency-Independent and Frequency-Dependent Nonlinear Models of TWT Amplifiers", *IEEE Transactions on Communications*, vol. Com-29, No. 11, Nov. 1981, pp. 1715-1720.
PCT International Search Report mailed Sep. 29, 2011, issued in related International Application No. PCT/CN2010/080197, Huawei Technologies Co., Ltd. (6 pages).
PCT Written Opinion mailed Sep. 29, 2011, issued in related International Application No. PCT/CN2010/080197, Huawei Technologies Co., Ltd. (5 pages).

* cited by examiner

*Primary Examiner* — Khanh V Nguyen

(57) ABSTRACT

A signal processing apparatus for processing an input signal (x) has an adaptive predistorter, an amplifier and a downconverter. The amplifier is configured to amplify a processed signal (y') to obtain an amplified signal (y"). The downconverter is configured to multiply a version of the processed signal (y') with a version of the amplified signal (y"), one of the signal versions being phase shifted, to obtain a first down-converted signal (z1, z1'), and to multiply the processed signal (y') with the amplified signal (y") to obtain a second down-converted signal (z2, z2'). The predistorter is configured to predistort the input signal (x) according to a predistortion characteristic to obtain the processed signal (y'), the predistorter being further configured to adapt the predistortion characteristic based on the first down-converted signal (z1, z1') and the second down-converted signal (z2, z2').

14 Claims, 3 Drawing Sheets

SIGNAL PROCESSING ARRANGEMENT AND SIGNAL PROCESSING METHOD

CROSS REFERENCE

This application is a continuation of International Application No. PCT/CN2010/080197, filed on Dec. 23, 2010, which is hereby incorporated by reference in its entirety.

TECHNICAL FIELD

The invention relates to the field of adaptive predistorters for radio frequency amplifiers.

BACKGROUND OF THE INVENTION

Radio transmitters usually use power amplifiers that are mostly affected by non-linear effects that cause spectral regrowth and impairments of the quality of the transmitted signals. As a counter-measure against such impairments, the signals to be amplified are predistorted, in particular digitally predistorted, to compensate for the non-linear effects. The predistortion is performed on the basis of a non-linear characteristic, which depends on the non-linear effects of the amplifier.

To estimate the non-linear characteristic of the predistorter, so called open-loop and closed-loop techniques may be deployed.

As to the open-loop methods, a non-linear characteristic for the predistorter is determined in advance and applied fixedly during operation. As to the closed-loop methods, the non-linear characteristic is adaptively varied in order to track the variation of the non-linear parameters due to temperature, aging and frequency changes of the amplifier. However, in the known methods, the output signal of the amplifier, which is usually a modulated radio frequency signal, is provided to a down-conversion chain comparable to that of a radio frequency receiver. For example, various local oscillator signals have to be generated for down-conversion, and the down-converted signal may have to be demodulated for obtaining baseband I- and Q-components.

U.S. Pat. No. 4,291,277 describes an amplifier with a predistorter, wherein an output signal of the amplifier is down-converted by mixing with a local oscillator signal and demodulated in a quadrature demodulator. The demodulated signal is used to update parameters of the predistorter. However, the effort for providing such a down-conversion chain for a transmitter may be considerable according to some implementations.

EP 2117115 A1 describes a transmission system in which a transmitter comprises a digital predistorter. Parameters of the predistorter are updated in a receiver, which provides these parameters to the predistorter via a return link. Since the receiver provides the parameters of the predistorter, the efficiency and the flexibility of the predistorter may be reduced.

SUMMARY OF THE INVENTION

It is the object of the invention to provide a concept for efficiently processing an input signal for predistortion.

This object is achieved by the features of the independent claims. Further embodiments are apparent from the dependent claims.

An input signal of an amplifier and an output signal of the amplifier may provide information about the non-linear parameters of the amplifier. By processing these input and output signals, baseband information can be obtained which can be used to adapt a non-linear predistortion characteristic used for predistorting a signal upstream to the amplifier. Hence, non-linear effects of the amplifier can be compensated by the predistortion while adaptively tracking changes of non-linear parameters of the amplifier. The adaptation of the predistortion characteristic does not need an expensive and complex down-conversion chain, thus reducing overall costs of a non-linear compensated amplifier.

According to a first aspect, the invention relates to a signal processing arrangement for processing an input signal. The signal processing arrangement comprises an amplifier configured to amplify a processed signal to obtain an amplified signal. Furthermore, the signal processing arrangement comprises a down-converter configured to multiply a version of the processed signal with a version of the amplified signal, one of the signal versions being phase-shifted, to obtain a first down-converted signal, and configured to multiply the processed signal with the amplified signal to obtain a second down-converted signal. The signal processing arrangement further comprises an adaptive predistorter configured to predistort the input signal according to a predistortion characteristic to obtain the processed signal, the predistorter being further configured to adapt the predistortion characteristic based on the first down-converted signal and the second down-converted signal. For example, the signal version being phase-shifted is 90° phase shifted. Hence, according to some implementation, the two multiplications performed by the down-converter may correspond to a complex multiplication, in particular a conjugate complex multiplication of the processed signal with the amplified signal. According to some implementation, the first and the second down-converted signal may correspond to complex components of the complex result of such multiplication.

According to a first implementation form of the first aspect, the invention relates to a signal processing arrangement, wherein the predistorter comprises a low-pass filter for filtering the first down-converted signal and the second down-converted signal. For example, radio frequency portions of the first and the second down-converted signals are filtered out such that basically only a DC portion of the respective signals remains in the filtered versions of the first and the second down-converted signals. For example, the DC components correspond to or are related to baseband components of the processed signals and/or the amplified signal.

According to a second implementation form of the first aspect, the invention relates to a signal processing arrangement, wherein the predistorter comprises and analog-to-digital converter for analog-to-digital converting of the first down-converted signal and the second down-converted signal. For example, the analog-to-digital converter is operated with a conversion rate corresponding to a signal rate of the input signal to be predistorted. According to some implementation, the conversion rate of the analog-to-digital converter may be lower than, in particular significantly lower than a frequency of the processed signal or the amplified signal, respectively.

According to a third implementation form of the first aspect, the invention relates to a signal processing arrangement, wherein the predistorter is configured to adapt the predistortion characteristic based on a mean-squared error algorithm or a least mean-squares algorithm. For example, the algorithm is directed to minimizing an error, in particular a mean-squared error with respect to a compensation of the non-linear effects of the amplifier.

For example, the algorithm depends on an error signal, wherein the predistorter is configured to derive a first component of the error signal using the first down-converted signal and to derive a second component of the error signal using the second down-converted signal. For example, the error signal is a complex error signal and complex components of the complex error signal are derived respectively from the first and the second down-converted signal.

According to a fourth implementation form of the first aspect, the invention relates to a signal processing arrangement, wherein the predistorter is configured to predistort the input signal based on a polynomial function forming the predistortion characteristic. For example, the polynomial function is a full Volterra approximation or a truncated Volterra approximation of a non-linear predistortion function, wherein Volterra coefficients determine the non-linear characteristic. Furthermore, the polynomial function may be any other non-linear representation of a non-linear predistortion function comprising polynomial terms and respective polynomial coefficients, which determine the non-linear characteristic.

According to a fifth implementation form of the first aspect, the invention relates to a signal processing arrangement, wherein the predistorter is configured to predistort the input signal based on a lookup table having entries forming the predistortion characteristic. For example, for each value of the input signal, the lookup table of the predistorter delivers a respective predistorted value to obtain the processed signal. The lookup table may have entries for complex input signals such that for a complex input value a complex predistorted output value is delivered.

According to a sixth implementation form of the first aspect, the invention relates to a signal processing arrangement, wherein the down-converter comprises a first multiplier for obtaining a first down-converter signal and a second multiplier for obtaining the second down-converted signal. For example, the first and/or the second multiplier comprise a Gilbert cell. According to some implementation, the first and the second multiplier are adapted to perform a multiplication of radio frequency signals.

According to a seventh implementation form of the first aspect, the invention relates to a signal processing arrangement, wherein the input signal is a digital signal and wherein the signal processing arrangement comprises a digital-to-analog converter which is arranged downstream the predistorter. For example, the predistorted digital input signal is converted to an analog signal by the digital-to-analog converter. The input signal and the predistorted input signal may be complex signals such that the digital-to-analog converter is adapted to perform a conversion of the complex components of the complex predistorted signal.

According to an eighth implementation form, the invention relates to a signal processing arrangement, which further comprises a quadrature mixer that is arranged downstream the predistorter. For example, the input signal and the predistorted input signal are complex signals, which are provided to the quadrature mixer for obtaining a quadrature-modulated signal. If the predistorted input signal is a digital signal, the quadrature mixer may be arranged upstream or downstream a digital-to-analog converter before the amplifier.

According to a ninth implementation form of the first aspect, the invention relates to a signal processing arrangement which further comprises an up-converter for a frequency up-conversion, the up-converter being arranged between the predistorter and the amplifier.

For example, the predistorted input signal or a quadrature modulated version of the predistorted input signal is up-converted to a radio frequency range by the up-converter. For example, the up-converter comprises one or more mixing stages with one or more local oscillator frequencies respectively.

According to a tenth implementation form of the first aspect, the invention relates to a signal processing arrangement, wherein the amplifier comprises a first coupler and a second coupler. The first coupler is configured to provide the processed signal to the down-converter, and the second coupler is configured to provide the amplified signal to the down-converter. For example, the first and/or the second coupler comprise a directional coupler. The first and the second coupler may launch a fraction of the processed signal and the amplified signal respectively to the down-converter.

According to a second aspect, the invention relates to a radio transmitter arrangement with a transmit path, the transmit path comprising a signal processing arrangement according to one of the above-described implementation forms.

According to a third aspect, the invention relates to a signal processing method for processing an input signal. The method comprises predistorting the input signal according to a predistortion characteristic to obtain a processed signal. The processed signal is amplified to obtain an amplified signal. A version of the processed signal is multiplied with a version of the amplified signal to obtain a first down-converted signal, wherein one of the signal versions is phase-shifted. The processed signal is multiplied with the amplified signal to obtain a second down-converted signal. The predistortion characteristic is adapted based on the first down-converted signal and the second down-converted signal.

Various implementation forms of the third aspect of the invention arise from the implementation forms of the first aspect of the invention described above.

BRIEF DESCRIPTION OF THE DRAWINGS

Further embodiments of the invention will be described with reference to the following figures, in which.

DETAILED DESCRIPTION OF THE INVENTION

Figure 1:
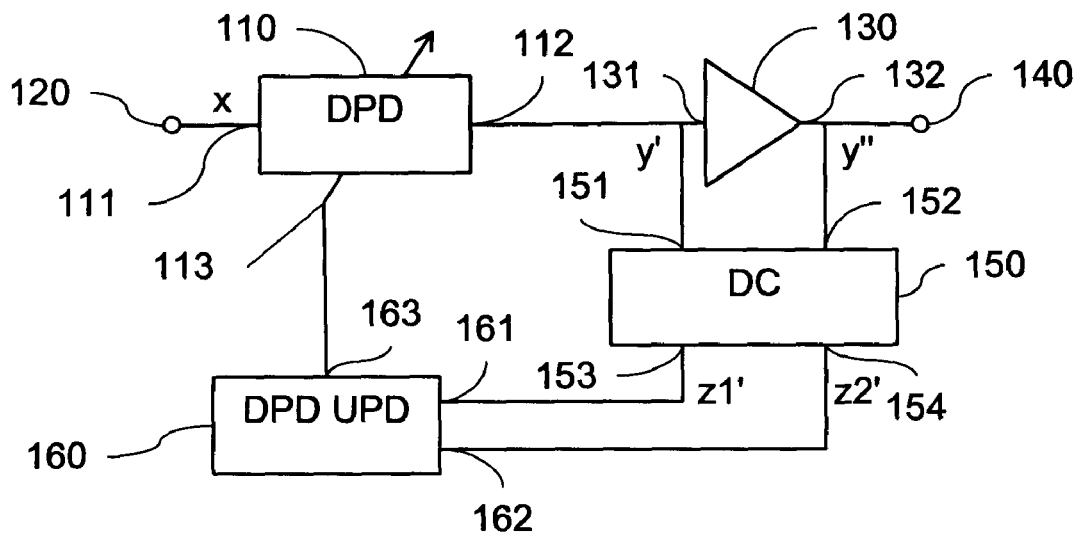
FIG. 1 shows a signal processing arrangement according to an implementation form.

FIG. 1 shows an embodiment of a signal processing arrangement. The signal processing arrangement comprises a predistortion block 110 with an input 111, an output 112 and a setting terminal 113. The input 111 of the predistortion block 110 is coupled to a signal input 120. The output 112 is coupled to an amplifier 130, in particular to an amplifier input 131. An amplifier output 132 is coupled to a signal output 140. The signal processing arrangement further comprises a down-converter 150 comprising a first input terminal 151 coupled to the amplifier input 131 and a second input terminal 152 coupled to the amplifier output 132. Respective outputs 153, 154 of the down-converter 150 are coupled to inputs 161, 162 of an update block 160. An output 163 of the update block 160 is coupled to the setting terminal 113 of the predistorter block 110.

The predistorter block 110 and the update block 160 are functional blocks of an adaptive predistorter. For example, the adaptive predistorter is realized by means of a signal processor. The functional blocks 110, 160 may be realized in software or as parts of a programmable circuit.

According to some implementation, the predistorter block 110 is a digital predistorter for predistorting an input signal x received from signal input 120. The predistorted input signal is processed to a processed signal y' which is an input signal for the amplifier 130. An amplified signal y" is obtained by means of the amplifier 130 amplifying the processed signal y'.

The predistorter block 110 performs a non-linear processing of the input signal x in order to compensate for non-linear effects introduced by the amplifier 130 into the amplified signal y". To this end, the predistorter block 110 comprises a predistortion characteristic, which can comprise non-linear portions.

The down-converter 150 obtains a first down-converted signal z1' and a second down-converted signal z2' based on the processed signal y' and the amplified signal y". The down-converter is in particular configured to multiply a version of the processed signal y' with a version of the amplified signal y" to obtain the first down-converted signal z1', wherein one of the signal versions is phase-shifted, in particular 90° phase shifted. The down-converter is further configured to multiply the processed signal y' with the amplified signal y" to obtain the second down-converted signal z2'.

The update block 160 further processes the first and the second down-converted signal z1', z2' in order to adapt the predistortion characteristic of the predistortion block 110. For example, the predistorter is configured to adapt the predistortion characteristic based on a mean-squared error algorithm or a least mean-square algorithm.

Figure 2:
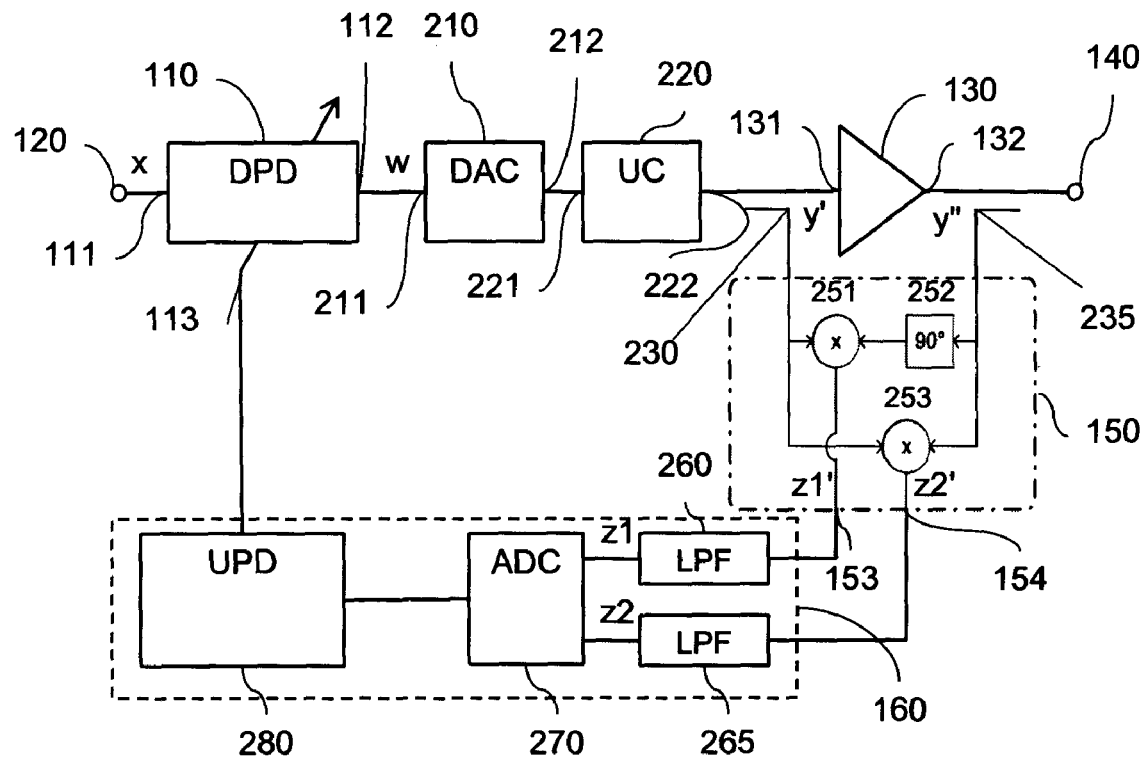
FIG. 2 shows a signal processing arrangement according to an implementation form.

FIG. 2 shows a further embodiment of a signal processing arrangement, which is based on the arrangement shown in FIG. 1. Identical or similar blocks, elements or signals are denoted with the same reference signs. A repetitive description of such blocks, elements or signals may be omitted in the following.

The signal processing arrangement of FIG. 2 further comprises a digital-to-analog converter 210 whose input 211 is coupled to the output 112 of the predistorter block 110 for receiving a predistorted version w of the input signal x. An output 212 of the digital-to-analog converter 210 is coupled to the amplifier input 131 by means of an up-conversion block 220. In particular, an input 221 of the up-conversion block is coupled to the output 212 of the digital-to-analog converter 210, and an output 221 of the up-conversion block 220 is coupled to the amplifier input 131. The up-conversion block for example comprises a quadrature mixer for generating a quadrature-modulated signal. The up-converter block 220 may further comprise an up-converter for frequency up-conversion of its input signal. To this end, the up-converter block 220 for example comprises one or more mixers for mixing with respective local oscillator signals.

The down-converter 150, on its input side, is coupled to the amplifier input 131 and to the amplifier output 132 by means of a first and a second coupler 230, 235. For example, the first and/or the second coupler 230, 235 are directional couplers. The down-converter 150 comprises a first multiplier 251, a phase shifter 252 and a second multiplier 253. The first multiplier 251 is configured to multiply a version of the processed signal y' with a phase-shifted version of the amplified signal y" to obtain the first down-converted signal z1'. The phase shifter 252 is a 90° phase shifter. The second multiplier 253 is configured to multiply the version of the processed signal y' with a version of the amplified signal y" to obtain the second down-converted signal z2'. In another implementation, the phase shifter 252 could be arranged such that the processed signal y' is phase-shifted. In this case, the first multiplier 251 performs a multiplication of a phase-shifted version of the processed signal y' with a version of the amplified signal y" to obtain the first down-converted signal z1'.

The update block 160 being coupled to the down-converter 150 comprises a first and a second low-pass filter 260, 265 for filtering the first and the second down-converted signal z1', z2', respectively. The filtered down-converted signals z1, z2 are provided to an analog-to-digital converter 270 whose output is coupled to an updater 280. For example, the updater 280 performs an update algorithm or adaptation algorithm for adapting the predistortion characteristic of the predistorter block 110.

The algorithm performed by the updater 280 may be based on the minimization of an error signal. In the following, it is described how the processed signal y' and the amplified signal y" may be processed to obtain an implementation of such adaptation algorithm.

In the following, the baseband equivalent representation of the signals x, y' and y", all of which are complex signals, are considered. The amplifier 130 can be modeled, for example, using a truncated Volterra series representation, as a complex polynomial function named p so that y"=p(y'). Under this assumption, the predistortion function of the predistorter block 110 may also be modeled and implemented as a complex polynomial function named q so that y'=q(x). The cascade of the two functions is:

$$f(x,\underline{c})=p(q(x))=c_1 x+c_2 x^2+c_3 x^3+\ldots+c_j x^j,$$

where $\underline{c}=[c_1,c_2,c_3,\ldots,c_j]$ is the vector of the coefficients of the polynomial function f. A "least square" method tries to minimize the error signal e=y"−x by the minimization of the sum of the residual squared errors:

$$S = \sum_i r_i^2,$$

where $$r_i = y_i'' - f(x_i, \underline{c})_i,$$

and where the subscript letter i indicates a time-sampled value of the signal e. The minimum of S is found setting the gradient to zero with respect to the vector c:

$$\frac{\partial S}{\partial c_j} = 2\sum_i r_i \frac{\partial r_i}{\partial c_j} \Rightarrow -2\sum_i r_i \frac{\partial f(x_i, \underline{c})}{\partial c_j} = 0$$

The gradient is:

$$\nabla S = -2(y_i'' - c_1 x_i - c_2 x_i^2 - c_3 x_i^3 - \ldots) \cdot \begin{pmatrix} x_i \\ x_i^2 \\ x_i^3 \\ \vdots \end{pmatrix},$$

and $$(y_i'' - c_1 x_i - c_2 x_i^2 - c_3 x_i^3 - \ldots) = e.$$

A stochastic gradient algorithm based on least squared errors, for example Least Mean Squares (LMS) is:

$$c_n = c_{n-1} - \mu \cdot \nabla S \Rightarrow \underline{c}_n = \underline{c}_{n-1} - \mu \cdot e \cdot \begin{pmatrix} x_i \\ x_i^2 \\ x_i^3 \\ \vdots \end{pmatrix},$$

where μ is a suitable small value that is the step-size used to control the convergence speed.

The digital signal x is feed to the predistorter block 110 to pre-compensate non-linear effects of the amplifier 130. After digital-to-analog conversion, for example by block 210, the signal is up-converted to a radio frequency (RF) signal y' by one or more up-conversion stages, e.g. block 220, that may use mixers with local oscillators. Signal y' is the radio frequency signal at the input of the amplifier 130 and y" is the output signal, namely the amplified signal y".

The non-linear distortion is expected to be mostly due to the amplifier 130 which may be a microwave power amplifier, so that signal y' can be assumed to be still nearly linear.

The down-converter 150 performs an analytical multiplication of y' and y" as described in the following equations. However, the down converter does not convert the signals y' and y" in a way that may be directly used to evaluate that error signal e. In the described implementation, signals z1 and z2 represent the real and imaginary part of the complex product conj(y')y" or conj(y")y', respectively. Due to the commutative propriety of the complex multiplication the two signals y' and y" at the input of the down-converter 150 can be exchanged without loosing generality.

Let be y'=I'+jQ' and y"=I"+jQ". The I and Q are the phase and quadrature representation of a quadrature modulated QAM signal. The complex product conj(y')y" is:

$$\text{conj}(y') \cdot y'' = (I'I'' + Q'Q'') + j(I'Q'' - Q'I'') \quad \text{(eq. 1)}$$

The band-pass modulated signal y' can be written as:

$$y'(t) = I'(t)\cos(\omega_0 t) - Q'(t)\sin(\omega_0 t),$$

where $\omega_0 = 2\pi f_0$ and $f_0$ is the carrier frequency. Defining $$A'(t) = \sqrt{I'(t)^2 + Q'(t)^2}$$

and $$\varphi'(t) = \arctan\left(\frac{I'(t)}{Q'(t)}\right),$$

the signal y' can also be written as $$y'(t) = A'(t)\cos(\omega_0 t + \varphi'(t)).$$

The output signal y" of the can be written, like above, as:

$$y''(t) = I''(t)\cos(\omega_0 t) - Q''(t)\sin(\omega_0 t),$$

where I"(t) and Q"(t) suffer the non-linear effects due to the amplifier 130.

According to some implementation forms, the multiplier 251 performs the following operation:

$$z1' = y''(t) \cdot y'(t + \pi/2) =$$
$$[I''(t)\cos(\omega_0 t) - Q''(t)\sin(\omega_0 t)] \cdot [-I'(t)\sin(\omega_0 t) - Q'(t)\cos(\omega_0 t)] =$$
$$-I'I''\sin(\omega_0 t)\cos(\omega_0 t) + I'Q''\sin^2(\omega_0 t) - Q'I''\cos^2(\omega_0 t) +$$
$$Q'Q''\cos(\omega_0 t)\sin(\omega_0 t) = -I'I''\sin(2\omega_0 t) +$$
$$I'Q''\left(\frac{1-\cos(2\omega_0 t)}{2}\right) - Q'I''\left(\frac{1+\cos(2\omega_0 t)}{2}\right) + Q'Q''\sin(2\omega_0 t)$$

After filtering with the low-pass filter 260, signal z1 results to $$z1 \approx \frac{1}{2}(I'Q'' - Q'I'').$$

That is equivalent to the imaginary part of (eq. 1), except the scaling factor ½.

According to some implementation forms, the multiplier 253 performs the following operation:

$$z2' = y''(t) \cdot y'(t) =$$
$$[I''(t)\cos(\omega_0 t) - Q''(t)\sin(\omega_0 t)] \cdot [I'(t)\cos(\omega_0 t) - Q'(t)\sin(\omega_0 t)] =$$
$$I'I''\cos^2(\omega_0 t) - I'Q''\cos(\omega_0 t)\sin(\omega_0 t) - Q'I''\cos(\omega_0 t)sen(\omega_0 t) +$$
$$Q'Q''\sin^2(\omega_0 t) == I'I''\left(\frac{1+\cos(2\omega_0 t)}{2}\right) -$$
$$I'Q''\sin(2\omega_0 t) - Q'I''\sin(2\omega_0 t) + Q'Q''\left(\frac{1-\cos(2\omega_0 t)}{2}\right)$$

After filtering with the low-pass filter 265, signal z2 results to $$z2 \approx \frac{1}{2}(I'I'' + Q'Q'').$$

That is equivalent to the real part of (eq. 1) except the scaling factor ½.

According to some implementation forms, the low-pass filters 260, 265 before the analog-to-digital converter 270 remove the higher frequency components at $2\omega_0 t$.

From the two components z1, z2 of the complex product conj(y')y", digitalized by the analog-to-digital converter 270, further processing is performed to obtain a digital estimation e' of the error e=x−y".

Introducing the signal w at the output 112 of the predistorter block 110, w is a digitalized equivalent representation of the RF domain signal y'. Assuming that $$y' = Kw,$$

where K is a constant matrix that depends on the up-conversion chain, one possible way to estimate the error e is done with the following processing of the complex signals:

$$e' = \frac{\text{conj}(w) \cdot x - \text{conj}(y') \cdot y''}{\text{conj}(w)} = \frac{\text{conj}(w) \cdot x - \text{conj}(Kw) \cdot y''}{\text{conj}(w)} = x - Ky''.$$

Since the constant K is independent from the minimization algorithm, minimizing e' is equivalent to the minimization of e. So the update process of the predistortion characteristic is driven by the minimization of the estimated error e'.

As a consequence, the down-conversion process performed in the down-converter 150 is able to replace a conventional down-conversion chain with down-mixers, local oscillators and further conventional elements.

Another possible method to exploit the signals z1, z2 is to directly estimate the magnitude error |H| and phase error $\phi_H$ of the amplifier 130:

$$|H| = |\text{conj}(y') \cdot y''|$$

$$\phi_H = \tan^{-1}(Im[H]/Re[H])$$

Repetitive measures of these quantities can be used to estimate the complex transfer function H of the amplifier 130 and compensate it in the predistorter block 110 using the function $H^{-1}$.

Figure 3:
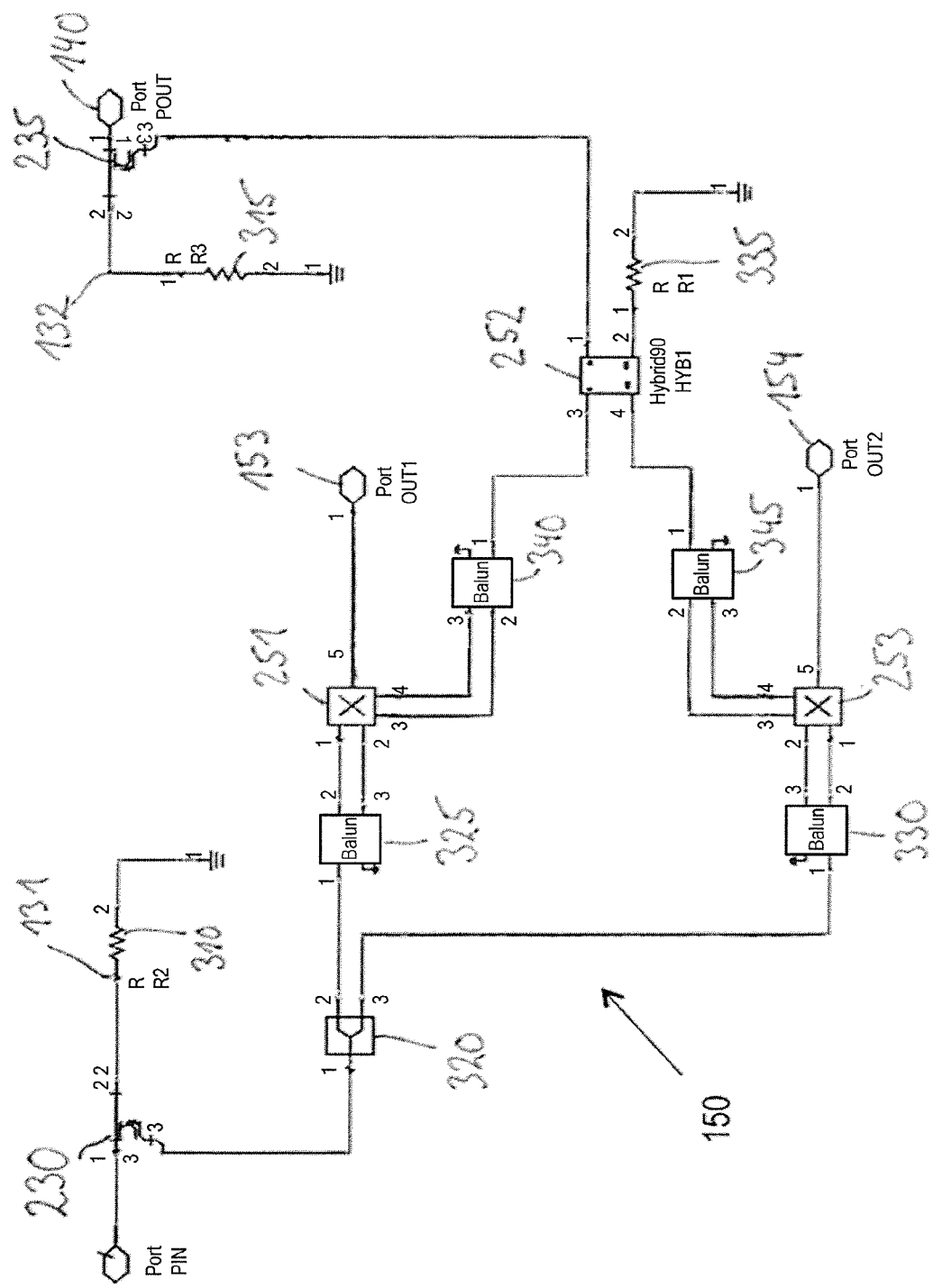
FIG. 3 shows a down-converter according to an implementation form.

FIG. 3 shows a possible implementation of the down-converter 150. The down-converter 150 is coupled to the amplifier input 131 by means of the first coupler 230 and to the amplifier output 132 by means of the coupler 235, wherein the amplifier 130 is represented by equivalent resistors 310, 315 in this figure. The down-converter 150 comprises a power splitter 320 for providing the processed signal y' both to the first multiplier 251 and the second multiplier 253. The power-splitter 320 is coupled to the multipliers 251, 253 by respective baluns 325, 330. The phase-shifter 255 is coupled to the coupler 235 and to a ground terminal by means of a resistor 335 on its input side. A shifted output of the phase-shifter 252, which may be a hybrid circuit, is coupled to the first multiplier 251 by means of a further balun 340. An unshifted version of the amplified signal y" is provided from the phase-shifter 252 to the second multiplier 253 by means of a balun 345. The multipliers 251, 253 may comprise a Gilbert cell. Outputs of the multipliers 251, 253 are coupled to outputs 153, 154 of the down-converter 150.

Figure 4:
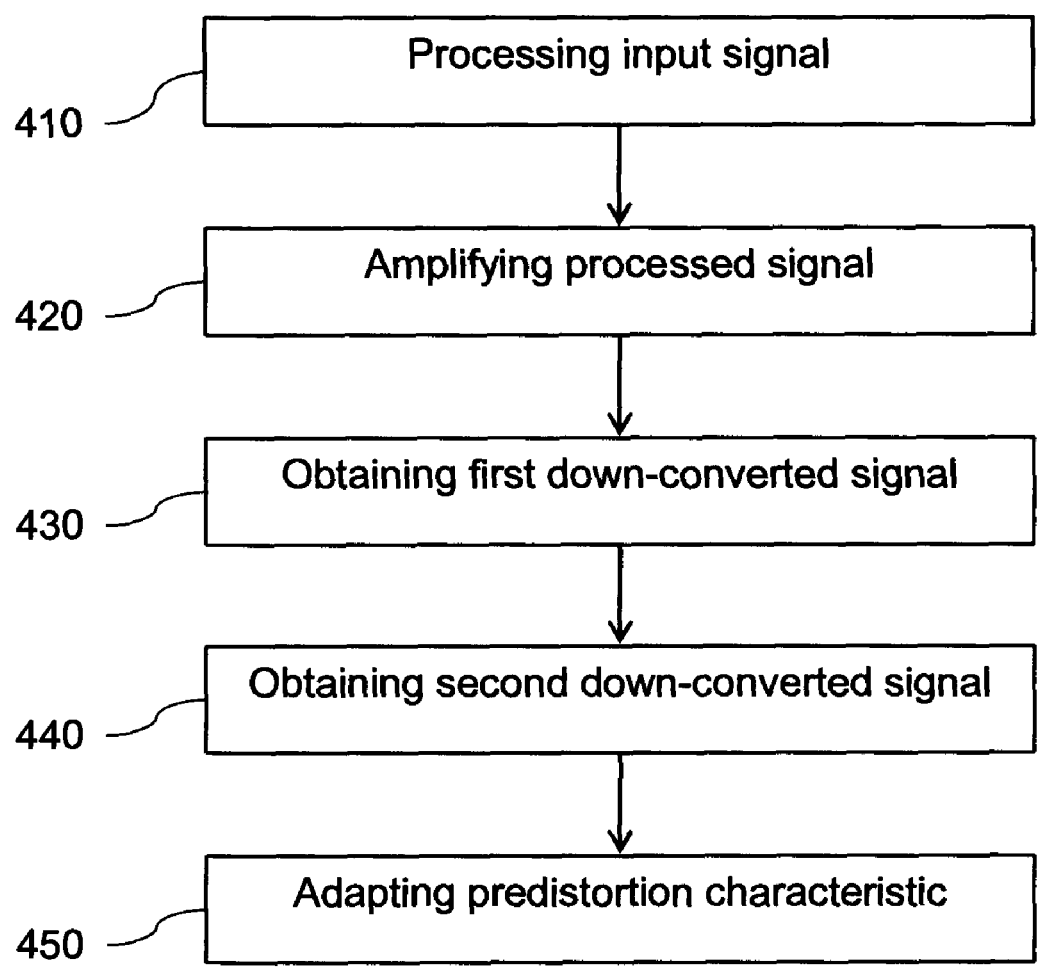
FIG. 4 shows a block diagram of a signal processing method according to an implementation form.

FIG. 4 shows an exemplary implementation of a signal processing method that may be employed in one of the arrangements described above.

In a step 410, an input signal is processed. For example, the input signal, which may be a complex digital signal, is pre-distorted according to a predistortion characteristic to obtain a processed signal. The predistortion can be performed by means of a polynomial function forming the predistortion characteristic. It is further possible that the predistortion is based on a lookup table having entries forming a predistortion characteristic.

The predistorted signal can be quadrature modulated and/or up-converted to a radio frequency signal in further processing steps to obtain the processed signal.

In step 420, the processed signal is amplified. For example, the amplification is performed by an amplifier, for example a microwave power amplifier. Such amplifier may have a transfer function, which may distort the amplified signal, in particular with non-linear effects. However, the predistortion performed in step 410 is configured for compensating for such effects, in particular non-linear effects, of the amplifier.

In step 430, a first down-converted signal is obtained as a function of the processed signal and the amplified signal. In particular, a version of the processed signal is multiplied with a version of the amplified signal to obtain the first down-converted signal, wherein one of the signal versions is phase shifted, in particular 90° phase shifted.

In step 440, a second down-converted signal is obtained. To this end, the processed signal is multiplied with the amplified signal to obtain the second down-converted signal.

In step 450, the predistortion characteristic is adapted based on the first down-converted signal and a second down-converted signal. Regarding the various methods how to process the first and the second down-converted signal to perform an adaptation of the predistortion characteristic, it is referred to the explanations made in conjunction with FIGS. 1 and 2.

The invention claimed is:

1. A signal processing apparatus for processing an input signal (x), the signal processing apparatus comprising:
an amplifier configured to amplify a processed signal (y') to obtain an amplified signal (y");
a down-converter configured to multiply a version of the processed signal (y') with a version of the amplified signal (y"), one of the signal versions being phase shifted, to obtain a first down-converted signal (z1, z1'), and to multiply the processed signal (y') with the amplified signal (y") to obtain a second down-converted signal (z2, z2'); and
an adaptive predistorter configured to predistort the input signal (x) according to a predistortion characteristic to obtain the processed signal (y'), the predistorter being further configured to adapt the predistortion characteristic based on the first down-converted signal (z1, z1') and the second down-converted signal (z2, z2').

2. The signal processing apparatus of claim 1, wherein the predistorter comprises a low-pass filter for filtering the first down-converted signal (z1') and the second down-converted signal (z2').

3. The signal processing apparatus of claim 1, wherein the predistorter comprises an analog-to-digital converter for analog-to-digital converting of the first down-converted signal (z1, z1') and the second down-converted signal (z2, z2').

4. The signal processing apparatus of claim 1, wherein the predistorter is configured to adapt the predistortion characteristic based on a mean-squared-error algorithm or a least-mean-square algorithm.

5. The signal processing apparatus of claim 4, wherein the algorithm depends on an error signal, and wherein the predistorter is configured to derive a first component of the error signal using the first down-converted signal (z1, z1'), and to derive a second component of the error signal using the second down-converted signal (z2, z2').

6. The signal processing apparatus of the claim 1, wherein the predistorter is configured to predistort the input signal (x) based on a polynomial function forming the predistortion characteristic or based on a look-up table having entries forming the predistortion characteristic.

7. The signal processing apparatus of claim 1, wherein the down-converter comprises a first multiplier for obtaining the first down-converted signal (z1, z1'), and a second multiplier for obtaining the second down-converted signal (z2, z2').

8. The signal processing apparatus of claim 1, wherein the input signal (x) is a digital signal, and wherein the signal processing apparatus comprises a digital-to-analog converter which is arranged downstream the predistorter.

9. The signal processing apparatus of claim 1, further comprising a quadrature mixer which is arranged downstream the predistorter.

10. The signal processing apparatus of claim 1, further comprising an up-converter for frequency up-conversion, the up-converter being arranged between the predistorter and the amplifier.

11. The signal processing apparatus of claim 1, wherein the signal version being phase shifted is 90° phase shifted.

12. The signal processing apparatus of claim 1, wherein the amplifier comprises a first coupler and a second coupler, the first coupler being configured to provide the processed signal (y') to the down-converter, the second coupler being configured to provide the amplified signal (y") to the down-converter.

13. A radio transmitter apparatus with a transmit path, the transmit path comprising a signal processing apparatus of claim 1.

14. A signal processing method for processing an input signal, the method comprising:
- predistorting the input signal (x) according to a predistortion characteristic to obtain a processed signal (y');
- amplifying the processed signal (y') to obtain an amplified signal (y");
- multiplying a version of the processed signal (y') with a version of the amplified signal (y"), one of the signal versions being phase shifted, to obtain a first down-converted signal (z1, z1');
- multiplying the processed signal (y') with the amplified signal (y") to obtain a second down-converted signal (z2, z2'); and
- adapting the predistortion characteristic based on the first down-converted signal (z1, z1') and the second down-converted signal (z2, z2').

* * * * *